United States Patent
Chang et al.

(10) Patent No.: US 9,148,143 B2
(45) Date of Patent: Sep. 29, 2015

(54) TOUCH DEVICE AND MANUFACTURING METHOD THEREOF

(71) Applicant: TPK Touch Systems (Xiamen) Inc., Xiamen (CN)

(72) Inventors: Heng-Yao Chang, Taoyuan (TW); Chen-Hsin Chang, Taoyuan (TW); Mengh-Sueh Wu, Taipei (TW); Che-l Wu, Hsinchu (TW); Lixian Chen, Xiamen (CN)

(73) Assignee: TPK Touch Systems (Xiamen) Inc., Xiamen (CN)

( * ) Notice: Subject to any disclaimer, the term of this patent is extended or adjusted under 35 U.S.C. 154(b) by 71 days.

(21) Appl. No.: 14/035,973

(22) Filed: Sep. 25, 2013

(65) Prior Publication Data

US 2014/0224635 A1     Aug. 14, 2014

(30) Foreign Application Priority Data

Sep. 27, 2012  (CN) .......................... 2012 1 0388195

(51) Int. Cl.
| | |
|---|---|
| *H03K 17/975* | (2006.01) |
| *H03K 17/96* | (2006.01) |
| *G06F 3/044* | (2006.01) |
| *H01H 11/00* | (2006.01) |

(52) U.S. Cl.
CPC ............ *H03K 17/9622* (2013.01); *G06F 3/044* (2013.01); *H01H 11/00* (2013.01); *G06F 2203/04103* (2013.01); *G06F 2203/04111* (2013.01); *Y10T 29/49105* (2015.01)

(58) Field of Classification Search
CPC ......... H05K 1/02; H05K 1/0298; H05K 1/09; G06F 3/041; G06F 3/0488; G06F 3/044; G06F 3/045
USPC .............. 200/600; 174/126.1, 126.2; 345/173
See application file for complete search history.

(56) References Cited

U.S. PATENT DOCUMENTS

| | | | |
|---|---|---|---|
| 7,656,392 B2 * | 2/2010 | Bolender ...................... 345/173 |
| 8,450,628 B2 * | 5/2013 | Yau et al. ...................... 200/600 |
| 2014/0124241 A1 * | 5/2014 | Yau et al. ...................... 174/250 |

FOREIGN PATENT DOCUMENTS

| | | |
|---|---|---|
| CN | 101869010 A | 10/2010 |
| CN | 102063232 A | 5/2011 |

* cited by examiner

*Primary Examiner* — Vanessa Girardi
(74) *Attorney, Agent, or Firm* — Gokalp Bayramoglu

(57) ABSTRACT

A manufacturing method of a touch device is disclosed. A substrate having a viewing region is provided. A plurality of first sensing electrodes and a plurality of second sensing electrodes insulated from and in a staggered arrangement with the plurality of first sensing electrodes are formed on the substrate corresponding to the viewing region, wherein a plurality of jumper regions are defined between the adjacent second sensing electrodes. An insulating layer is formed on the plurality of first sensing electrodes and the plurality of second sensing electrodes. A plurality of jumpers is transfer-printed onto the insulating layer, wherein the plurality of jumpers is electrically connected to the adjacent second sensing electrodes and insulated from the first sensing electrodes by the insulating layer. A touch device is also disclosed.

19 Claims, 10 Drawing Sheets

TOUCH DEVICE AND MANUFACTURING METHOD THEREOF

BACKGROUND OF THE DISCLOSURE

All related applications are incorporated by reference. The present application is based on, and claims priority from, China Application Serial Number No. 201210388195.2, filed on Sep. 27, 2012, the disclosure of which is hereby incorporated by reference herein in its entirety.

FIELD OF THE DISCLOSURE

The present disclosure relates to touch technology, and in particular to a touch device and manufacturing method thereof.

DESCRIPTION OF THE RELATED ART

With the developments in the field of information technology, touch devices increasingly used to provide a convenient way to deliver information between humans and machines. A typical touch device is formed by a plurality of electrodes in the x-direction and a plurality of electrodes in the y-direction in a staggered arrangement. For example, the electrodes in the x-direction and the electrodes in the y-direction are disposed on the same side of a transparent substrate. Jumpers are connected to the adjacent electrodes in the y-direction. An insulating layer is disposed between the jumpers and the electrodes in the x-direction, such that the electrodes in the x-direction and the electrodes in the y-direction are insulated from each other and conductive in respective direction.

Generally, a method for manufacturing the touch device comprising multiple layers such as the jumpers, the insulating layer and the electrodes, comprises sequentially forming the electrodes in the x-direction and the electrodes in the y-direction, the insulating layer covering the electrodes in the x-direction, and the jumpers connecting the electrodes in the y-direction on the substrate by performing multiple exposure, and developing processes.

However, in the above-mentioned method for manufacturing the touch device, the previously formed layer structure may be damaged during the formation of the next layer structure thereon. For example, the electrodes may be cracked or delaminated from the substrate after undergoing several rounds of vacuum sputtering, exposure and developing processes.

Accordingly, there exists a need in the art for development of methods for forming a structure of a touch device capable of mitigating or eliminating the aforementioned problems.

SUMMARY OF THE DISCLOSURE

The present disclosure provides a touch device and manufacturing method thereof wherein at least jumpers are formed by a transfer-printing process so as to reduce or eliminate damage to the previously formed layer structure during the formation of the next layer thereon, and therefore improving the yield.

An exemplary embodiment of a manufacturing method of a touch device according to the present disclosure is provided. The manufacturing method comprises providing a substrate having a viewing region. A plurality of first sensing electrodes and a plurality of second sensing electrodes insulated from and in a staggered arrangement with the plurality of first sensing electrodes are formed on the substrate corresponding to the viewing region, wherein a plurality of jumper regions are defined between adjacent second sensing electrodes of the plurality of second sensing electrodes. An insulating layer is formed on the plurality of first sensing electrodes. A plurality of jumpers is transfer-printed onto the insulating layer, wherein the plurality of jumpers is electrically connected to the adjacent second sensing electrodes and insulated from the first sensing electrodes by the insulating layer.

An exemplary embodiment of a touch device according to the present disclosure is provided. The touch device comprises a substrate having a viewing region, a plurality of first sensing electrodes, a plurality of second sensing electrodes, an insulating layer, and a plurality of jumpers. The plurality of first sensing electrodes is insulated from and in a staggered arrangement with the plurality of second sensing electrodes on the substrate corresponding to the viewing region, wherein a plurality of jumper regions are defined between adjacent second sensing electrodes of the plurality of second sensing electrodes. The insulating layer is disposed on the plurality of first sensing electrodes. The plurality of jumpers is disposed on the insulating layer by a transfer-printing process and corresponds to the jumper regions, and the plurality of jumpers is electrically connected to the adjacent second sensing electrodes and insulated from the first sensing electrodes by the insulating layer.

According to the embodiments, at least the jumpers of the touch device are formed by the transfer-printing process, such that damage to the previously formed layer structure during the formation of the next layer thereon is reduced or eliminated and the yield is improved. In addition, using transfer-printing process instead of the sputtering, exposure and developing processes simplifies the manufacturing process and improve production efficiency. Moreover, the use of expensive equipment (such as the equipment for the sputtering, exposure and developing processes) is not required. As a result, price competitiveness is improved and the pollution caused by chemical solutions is, also reduced.

DETAILED DESCRIPTION OF THE EMBODIMENTS

Figure 1A:
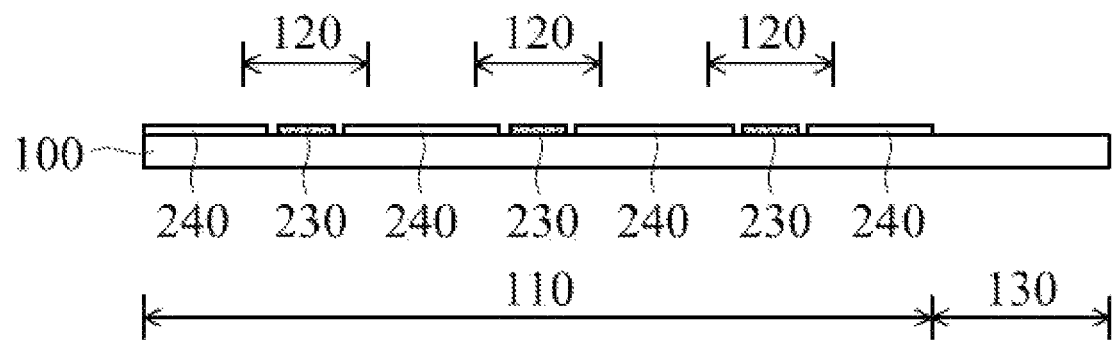
FIG. 1A to FIG. 1E-2 are cross-sectional views of a manufacturing method of a touch device in accordance with an embodiment of the present disclosure.

The following description is of the best-contemplated mode of carrying out the invention. This description is provided for the purpose of illustrating the general principles of the invention and should not be taken in a limiting sense. The scope of the invention is best determined by reference to the appended claims. Moreover, the same or similar elements in the drawings and the description are labeled with the same reference numbers.

Figures 1, 1B:
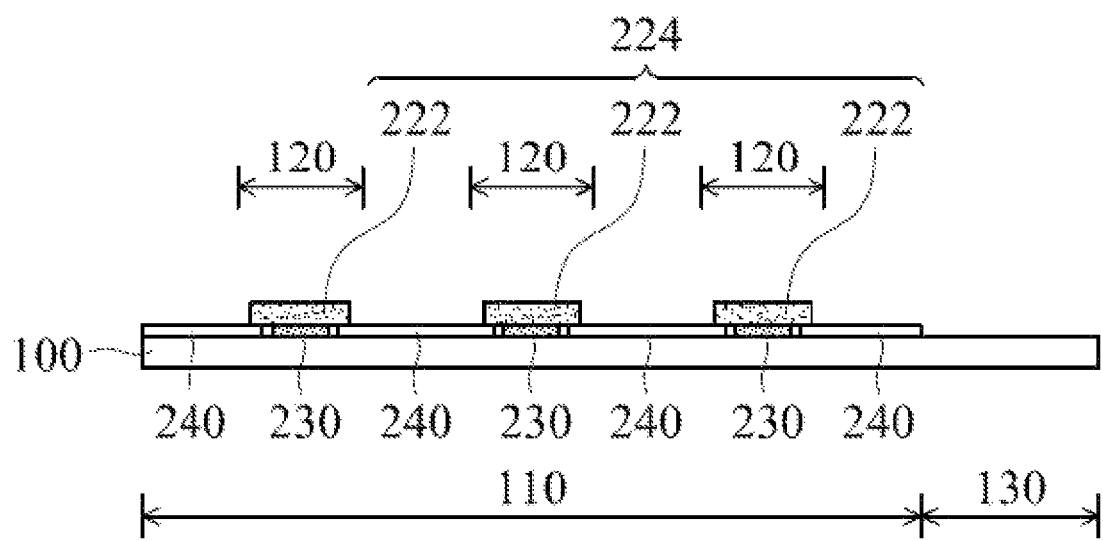
Figures 1, 1B, 2:
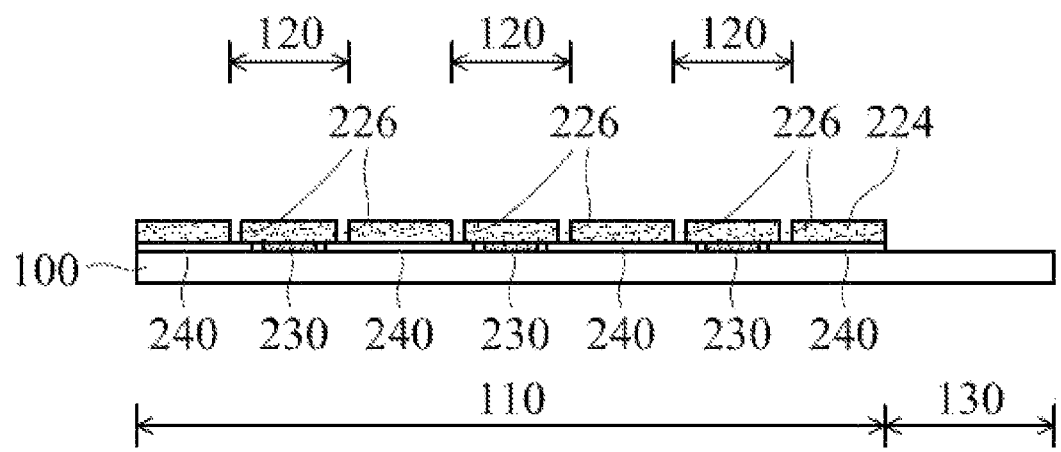
Figure 1C:
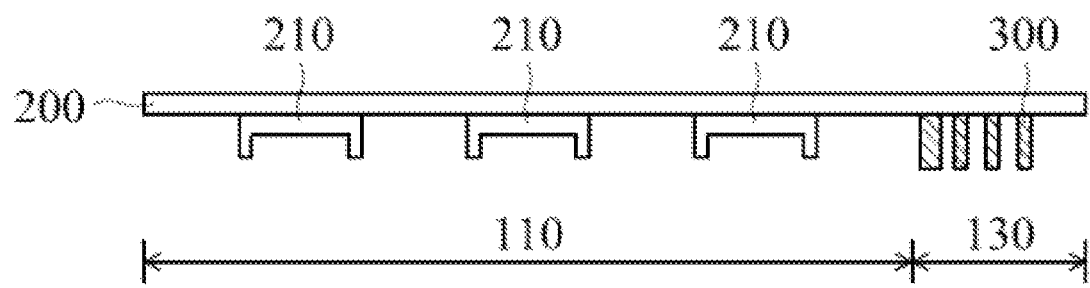
Figures 1, 1D:
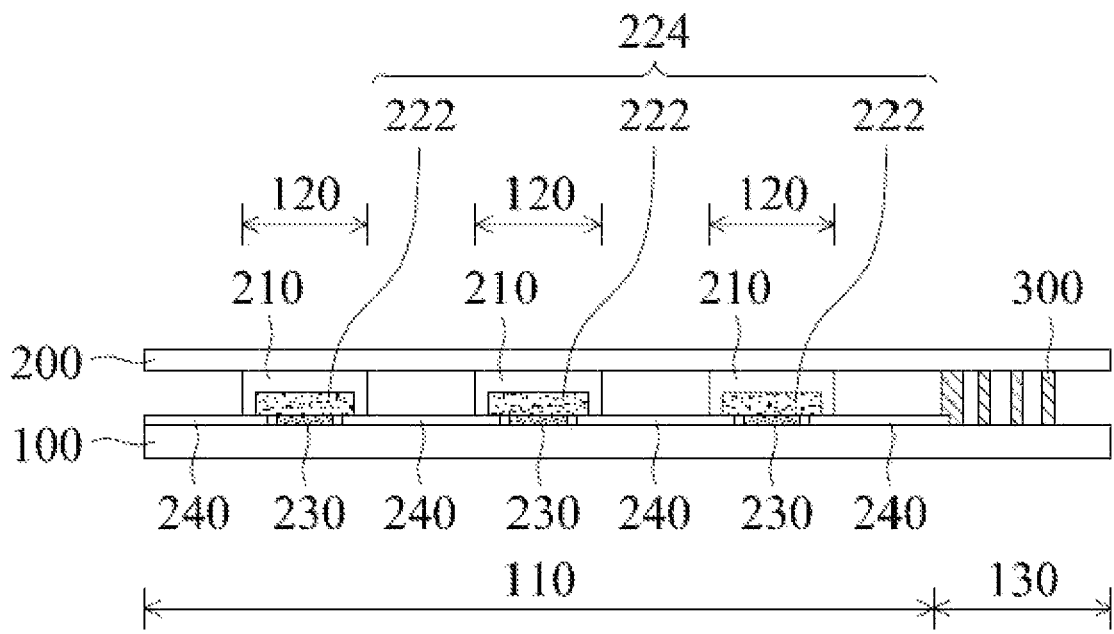
Figures 1, 1D, 2:
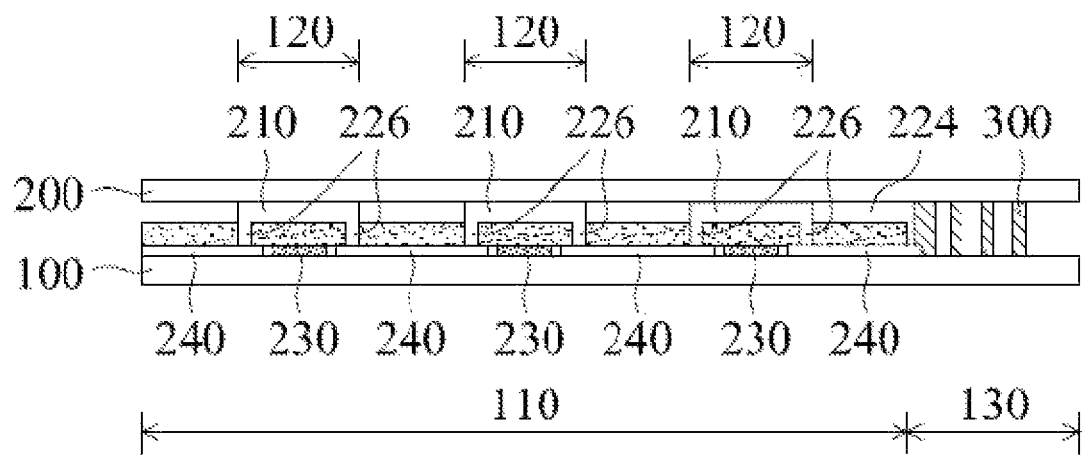
Figure 4:
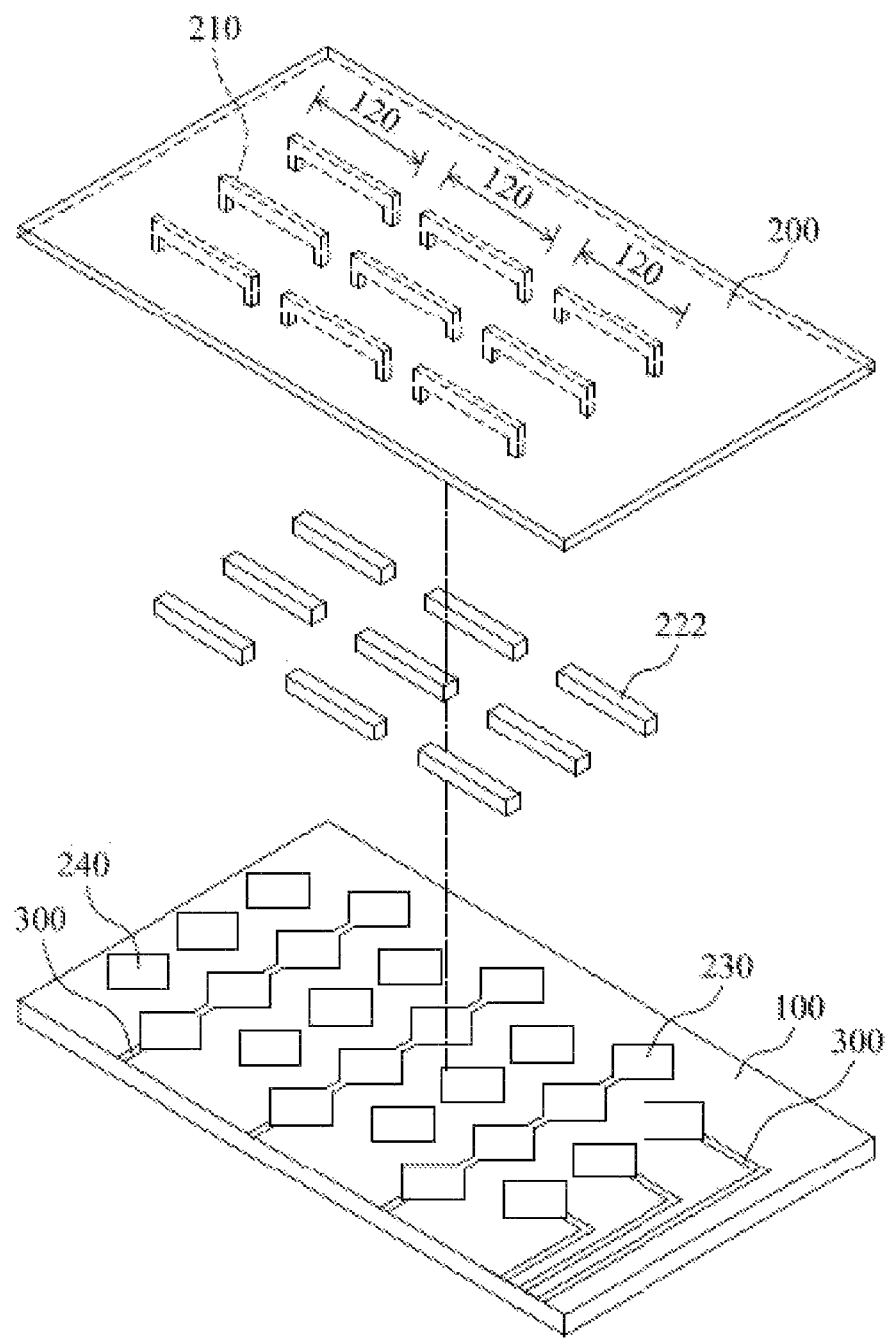
FIG. 4 is an exploded diagram of a touch device in accordance with an embodiment of the present disclosure.

Referring to FIG. 1D-1 and FIG. 4, a cross-sectional view and an exploded view of an exemplary embodiment of a touch device according to the present disclosure are illustrated. In the present embodiment, the touch device comprises a substrate 100, a plurality of jumpers 210, an insulating layer 224, a plurality of first sensing electrodes 230, a plurality of second sensing electrodes 240 and a transfer-printing film 200. The substrate 100 has a viewing region 110. The first sensing electrodes 230 and the second sensing electrodes 240 are insulated from each other and in a staggered arrangement on the substrate 100 corresponding to the viewing region 110. The first sensing electrodes 230 are arranged along a first axial direction, such as the x-direction, and each of the first sensing electrodes 230 is a continuous structure. The second sensing electrodes 240 are arranged apart from each other along a second axial direction, such as the y-direction. Jumper regions 120 are defined between the adjacent second sensing electrodes 240. The first axial direction and the second axial direction intersect with each other. For example, the first axial direction and the second axial direction are perpendicular to each other, but it is not limited thereto. The jumper regions 120 are in the viewing region 110. The insulating layer 224 is disposed on the first sensing electrodes 230 and the second sensing electrodes 240. The jumpers 210 are spaced apart from each other on the transfer-printing film 200 and correspond to the jumper regions 120. The plurality of jumpers 210 is electrically connected to the adjacent second sensing electrodes 240 and insulated from the first sensing electrodes 230 by the insulating layer 224.

The first sensing electrodes 230 and the second sensing electrodes 240 of the present embodiment may be formed by a photolithography process including sputtering, exposure and developing process, wherein the materials of the first sensing electrodes 230 and the second sensing electrodes 240 may comprise indium tin oxide (ITO), indium zinc oxide (IZO), indium tin fluorine oxide (ITFO), aluminum zinc oxide (AZO), fluorine zinc oxide (FZO), or other high-temperature-resistant materials. In other embodiment, the first sensing electrodes 230 and the second sensing electrodes 240 of the present embodiment may be formed by a screen printing and etching process. The materials of the first sensing electrodes 230 and the second sensing electrodes 240 may be, but not limited to, optical transparent conductive ink comprising colloid solution of nano silver, colloid solution of indium tin oxide (ITO), colloid solution of indium zinc oxide (IZO), colloid solution of indium tin fluorine oxide (ITFO), colloid solution of aluminum zinc oxide (AZO), colloid solution of fluorine zinc oxide (FZO), colloid solution of nano carbon tube, or colloid solution of conductive polymer, such as, but not limited to, colloid solution of poly(3,4-ethylenedioxythiophene) (PEDOT). The conductivity of the transparent conductive ink may be greater than 1/Ωcm.

In the embodiment, the insulating layer 224 comprises a plurality of insulating spacers 222 spaced apart from each other. The insulating spacers 222 correspond to the jumper regions 120 and are disposed on the first sensing electrodes 230. The insulating spacers 222 electrically insulate each jumper 210 electrically connected to the adjacent second sensing electrodes 240 from the first sensing electrodes 230. The insulating layer 224 of the present embodiment may be formed by a screen printing and etching process or a photolithography process.

The jumpers 210 are disposed onto the insulating spacers 222 by a transfer-printing process and electrically connected to the adjacent second sensing electrodes 240. For example, the jumpers 210 may be formed on the transfer-printing film 200 by the printing process, such as the gravure printing process. Next, the transfer-printing film 200 having the jumpers 210 is attached to the substrate 100 by the transfer-printing process, such that the jumpers 210 correspond to the jumper regions 120 and are electrically connected to the adjacent second sensing electrodes 240. Each jumper 210 is insulated from the first sensing electrode 230 by the insulating layer 224.

In another embodiment, as shown in FIG. 1D-2, the insulating layer 224 may be a continuous layer and comprise a plurality of pairs of holes 226 corresponding to the jumper regions 120, such that the plurality of jumpers 210 is electrically connected to the adjacent second sensing electrode 240 through each pair of holes 226. The insulating layer 224 is disposed on the first sensing electrodes 230 and the second sensing electrodes 240.

In the embodiment, the substrate 100 may further comprise a border region 130 surrounding the viewing region 110. Moreover, the touch device further comprises a plurality of traces 300 disposed on the substrate 100 corresponding to the border region 130 to electrically connect to the first sensing electrodes 230 and the second sensing electrodes 240.

Figures 1, 1E:
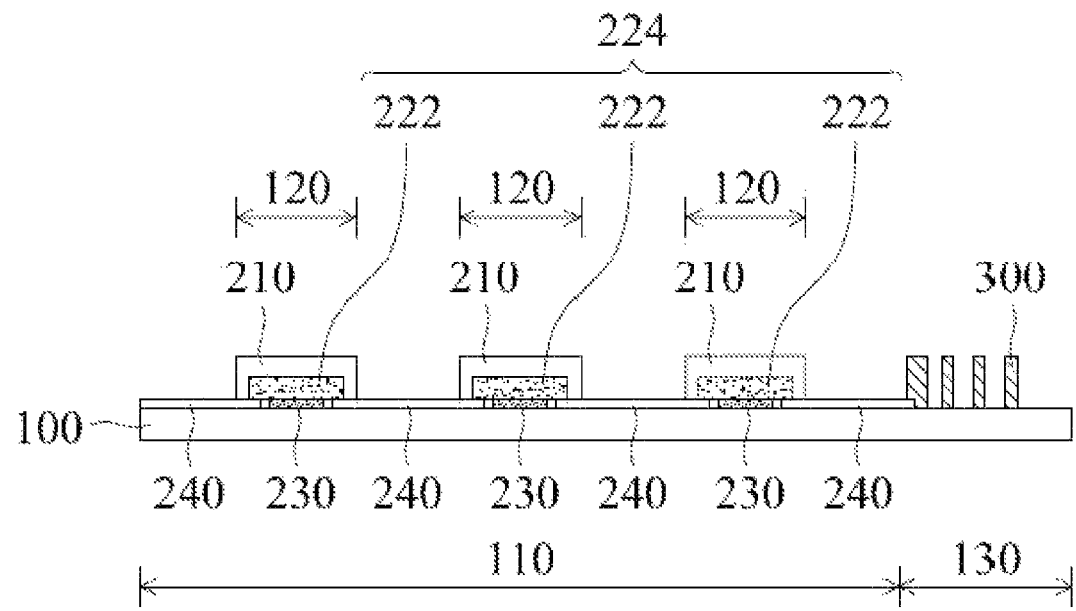
Figures 1, 1E, 2:
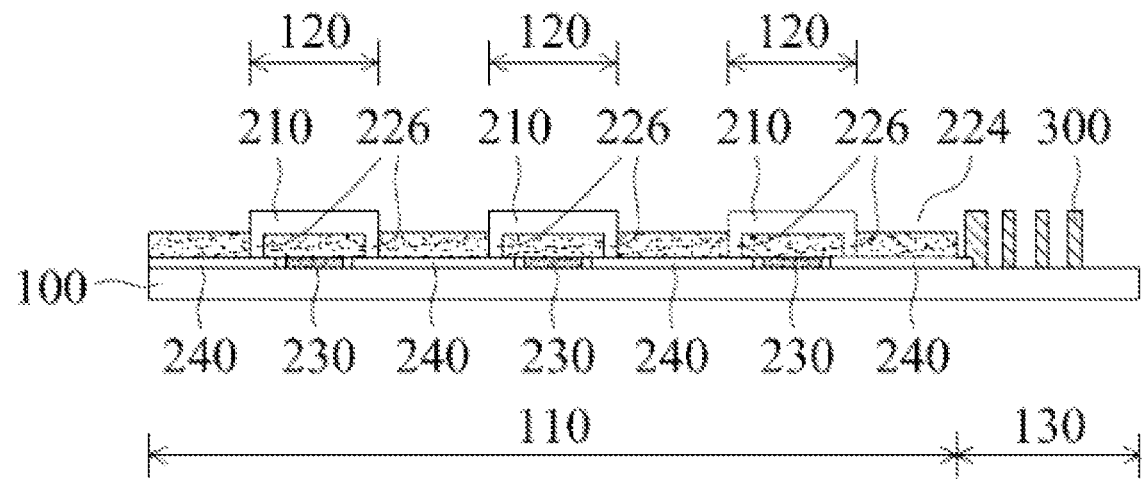

Referring to FIG. 1E-1 and FIG. 1E-2, in order to subsequently manufacture other functional layers, such as a protective layer or an anti-refractive layer of the touch device or help the touch device to attach to other electronic elements, such as a display module, the transfer-printing film 200 may be removed or stripped from the substrate 100. When the touch device is attached to other electronic elements, a surface of the substrate 100 that is opposite to the surface of the substrate 100 where the first sensing electrodes 230 and the second sensing electrodes 240 are formed thereon, is formed as a touching surface for users.

In the present embodiment, since the transfer-printing process is performed at a low temperature, the previously formed layer structures before the plurality of jumpers 210, such as the insulating layer 224, the first sensing electrodes 230 and the second sensing electrodes 240, would not be damaged by a high temperature. In other embodiments, the plurality of jumpers 210 and the insulating later 224 can be formed by the transfer-printing process. The previously formed layer structures before the jumpers 210 and the insulating layer 224, such as the first sensing electrodes 230 and the second sensing electrodes 240, would not be damaged by the high temperature. Further, in other embodiments, the plurality of jumpers 210, the insulating layer 224, the first sensing electrodes 230, and the second sensing electrodes 240 can be totally formed by the transfer-printing process.

FIG. 1A to FIG. 1E-2 are cross-sectional views of an exemplary embodiment of a manufacturing method of the touch device according to the present disclosure. Referring to FIG. 1A, a substrate 100 is provided. The substrate 100 is divided into a viewing region 110 and a border region 130 surrounding the viewing region 110. A plurality of first sensing electrodes 230 and a plurality of second sensing electrodes 240 are formed on the substrate 100 corresponding to the viewing region 110, wherein the first sensing electrodes 230 are arranged along a first axial direction, such as the x-direction, and each of the first sensing electrodes 230 is a continuous structure. The second sensing electrodes 240 are arranged apart from each other along a second axial direction, such as the y-direction. Jumper regions 120 are defined between the adjacent second sensing electrodes 240. The first sensing electrodes 230 and the second sensing electrodes 240 of the present embodiment may be formed by a photolithography process including sputtering, exposure and developing processes.

Next, referring to FIG. 1B-1, an insulating layer 224 is formed on the first sensing electrodes 230 and the second sensing electrodes 240 by the photolithography process. The insulating layer 224 comprises a plurality of insulating spacers 222 spaced apart from each other. The insulating spacers 222 are disposed on the first sensing electrodes 230 and insulate the first sensing electrode 230 from a subsequently formed plurality of jumpers 210 to be connected to the adjacent second sensing electrodes 240. In another embodiment, referring to FIG. 1B-2, the insulating layer 224 may be a continuous layer and comprises a plurality of pairs of holes 226 corresponding to the jumper regions 120.

Next, referring to FIGS. 1C, 1D-1 and 1D-2, the jumpers 210 that are transfer-printed onto the insulating layer 224 are illustrated. Each jumper 210 is electrically connected to the adjacent second sensing electrodes 240 and insulated from the first sensing electrodes 230 by the insulating layer 224. First, as shown in FIG. 1C, a transfer-printing film 200 used to perform a transfer-printing process is provided. The plurality of jumpers 210 spaced apart from each other is then formed on the transfer-printing film 200 by a first printing process, such as a gravure printing process. A plurality of traces 300 is formed on the transfer-printing film 200 by a second printing process. The traces 300 correspond to the border region 130. In other embodiments, the jumpers 210 and the traces 300 may be simultaneously formed by the first printing process.

Then, referring to FIG. 1D-1 followed FIGS. 1B-1 and 1C, the transfer-printing film 200 having the jumpers 210 and the traces 300 is attached to the substrate 100. The jumpers 210 on the transfer-printing film 200 are electrically connected to the adjacent second sensing electrodes 240 by the above-mentioned transfer-printing process. The insulating spacers 222 are disposed between the first sensing electrodes 230 and the jumpers 210, such that the jumpers 210 and the first sensing electrode 230 are electrically insulated from each other. The traces 300 are on the substrate 100 corresponding to the border region 130 to be electrically connected to the first sensing electrodes 230 and the second sensing electrodes 240, respectively. In another embodiment, referring to FIG. 1D-2 followed FIGS. 1B-2 and 1C, as the insulating layer 224 is a continuous layer, each jumper 210 is electrically connected to the adjacent second sensing electrode 240 through each pair of holes 226.

Moreover, after the step of attaching the transfer-printing film 200 having the jumpers 210 and the traces 300 to the substrate 100, a heat or ultraviolet treatment may be performed according to the materials of the transfer-printing film 200, thereby curing the jumpers 210 and the traces 300.

Next, referring to FIGS. 1E-1 and 1E-2, in order to subsequently manufacture other functional layers, such as a protective layer or an anti-refractive layer of the touch device or help the touch device to attach to other electronic elements, such as a display module, the transfer-printing film 200 may be removed or stripped from the substrate 100. When the touch device is attached to other electronic elements, a surface of the substrate 100 that is opposite to the surface of the substrate 100 where the first sensing electrodes 230 and the second sensing electrodes 240 are formed thereon, is formed as a touching surface for users.

In other embodiments, the traces 300 and the jumpers 210 can be formed independently, for example, the traces 300 may be formed on the substrate 100 corresponding to the border region 130 by another transfer-printing process or silk screen printing process to be electrically connected to the first sensing electrodes 230 and the second sensing electrodes 240.

Figure 2A:
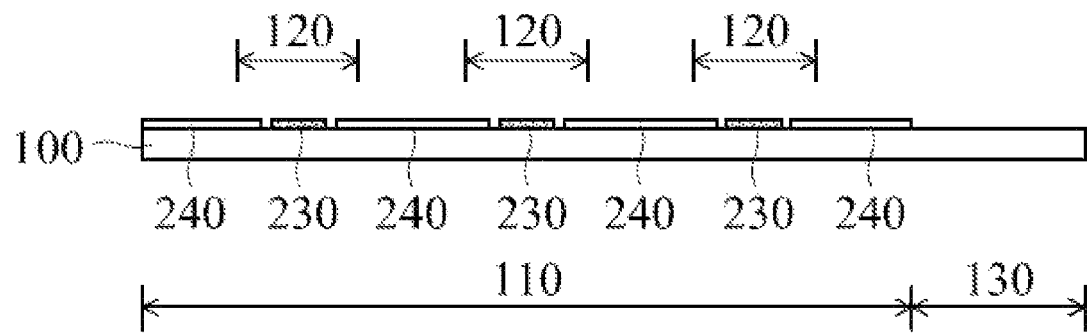
FIG. 2A to FIG. 2E are cross-sectional views of a manufacturing method of a touch device in accordance with another embodiment of the present disclosure.

FIGS. 2A to 2E are cross-sectional views of an exemplary embodiment of a manufacturing method for the touch device according to the present disclosure, wherein elements in FIGS. 2A to 2E that are the same as those in FIGS. 1A to 1E-2 are labeled with the same reference numbers as in FIGS. 1A to 1E-2 and are not described again for brevity. Referring to FIG. 2A, a substrate 100 is provided. The substrate 100 is divided into a viewing region 110 and a border region 130 surrounding the viewing region 110. A plurality of first sensing electrodes 230 and a plurality of second sensing electrodes 240 are formed on the substrate 100 corresponding to the viewing region 110. The configurations and forming methods of the first sensing electrodes 230 and the second sensing electrodes 240 in the embodiment are substantially the same as that of the corresponding embodiment in FIG. 1A, and so the description of the same is omitted herein for brevity.

Figure 2B:
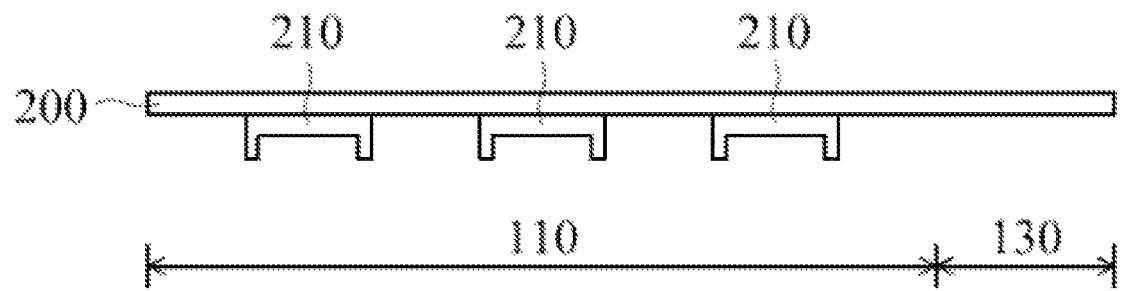
Figure 2C:
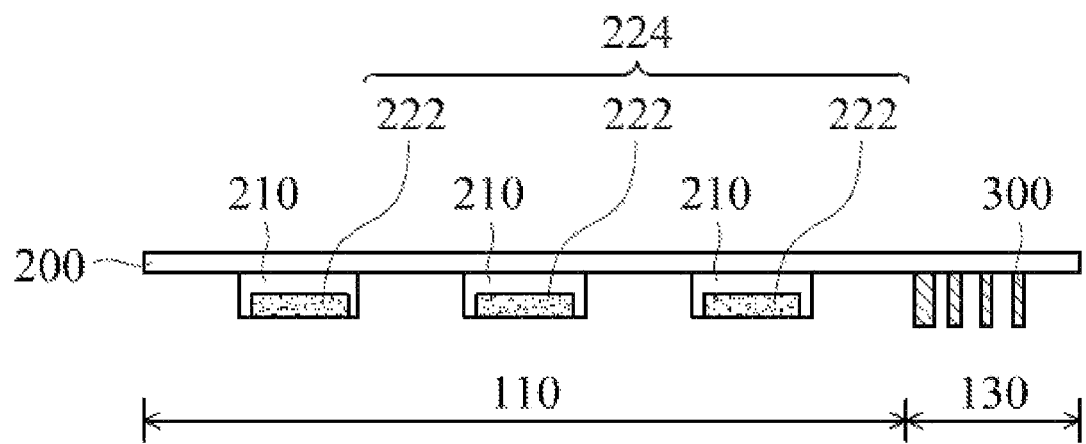
Figure 2D:
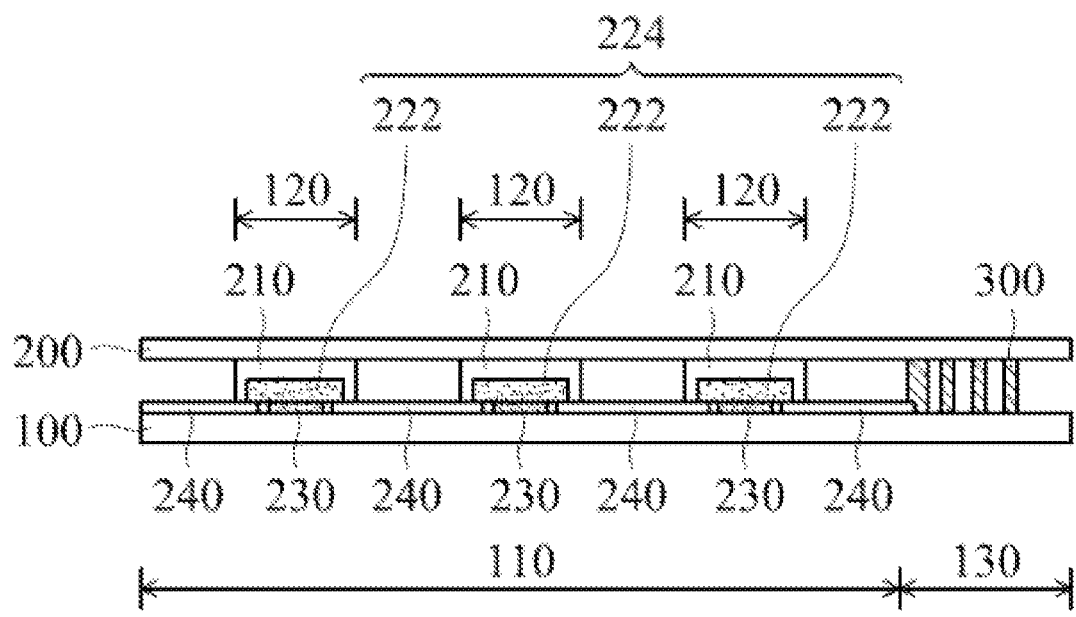

Referring to FIGS. 2B to 2D, an insulating layer 224 and a plurality of jumpers 210 formed onto the first sensing electrodes 230 and the second sensing electrodes 240 by a transfer-printing process are illustrated, wherein each jumper 210 respectively corresponds to a jumper region 120 and is electrically connected to the adjacent second sensing electrodes 240. The jumpers 210 and the first sensing electrodes 230 are insulated from each other by the insulating layer 224. In this embodiment, the insulating layer 224 comprises a plurality of insulating spacers 222 spaced apart from each other. In another embodiment, similar to the embodiment in FIG. 1D-2, the insulating layer (not shown) may be a continuous layer and comprise a plurality of pairs of holes. Referring to FIG. 2B, a transfer-printing film 200 is provided. The plurality of jumpers 210 spaced apart from each other may be formed on the transfer-printing film 200 by a first printing process.

Referring to FIG. 2C, an insulating member 222 is correspondingly formed on each jumper 210 by a second printing process. A plurality of traces 300 is then formed on the transfer-printing film 200 corresponding to the border region 130. The insulating layer 224 is composed of insulating ink materials, such as, but not limited to, optical transparent ink, and has a conductivity less than $10^{-10}/\Omega cm$. Moreover, the traces 300 may be composed of conductive ink, such as, but not limited to, silver colloid, copper colloid or carbon colloid, and has a conductivity greater than $1/\Omega cm$. In other embodiments, the jumpers 210 and the traces 300 may be simultaneously formed by the first printing process.

Referring to FIG. 2D, the transfer-printing film 200 having the jumpers 210, insulating spacers 222, and the traces 300 is attached to the substrate 100, such that the jumpers 210 on the transfer-printing film 200 correspond to the jumper regions 120 and are electrically connected to the adjacent second sensing electrodes 240. The insulating spacers 222 are disposed between the first sensing electrodes 230 and the jumpers 210, such that the jumpers 210 and the first sensing electrode 230 are electrically insulated from each other. The traces 300 are on the substrate 100 corresponding to the border region 130 to be electrically connected to the first sensing electrodes 230 and the second sensing electrodes 240, respectively. Moreover, after the step of attaching the transfer-printing film 200 having the jumpers 210, the insulating layer 224 and the traces 300 to the substrate 100, a heat or ultraviolet treatment may be performed according to the materials of the transfer-printing film 200, thereby curing the jumpers 210, the insulating layer 224, and the traces 300.

Figure 2E:
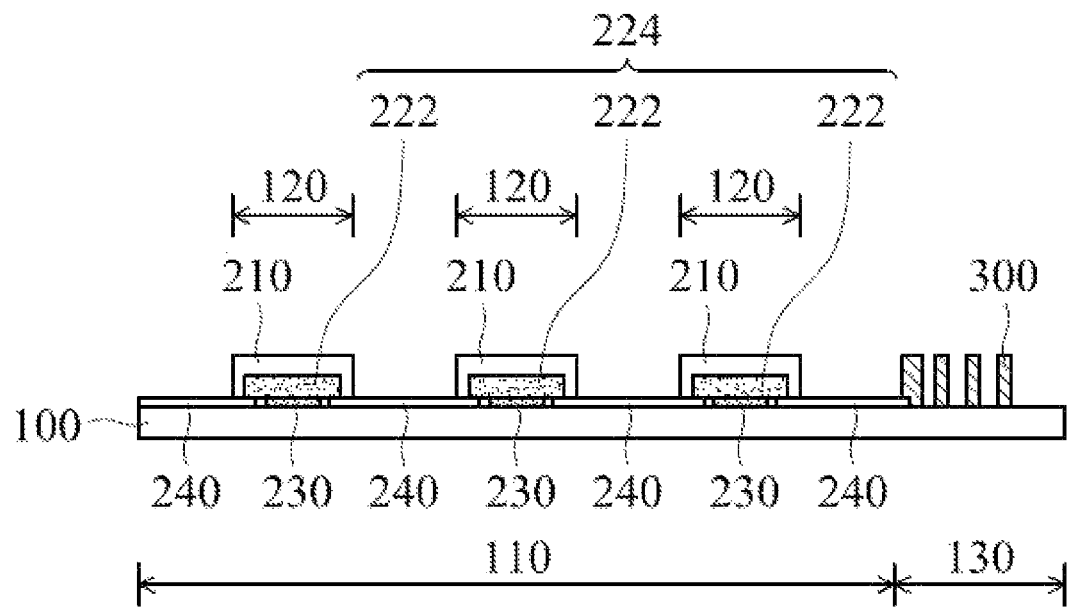

Referring to FIG. 2E, in order to subsequently manufacture other functional layers, such as a protective layer or an anti-refractive layer, of the touch device or help the touch device to attach to other electronic elements, such as a display module, the transfer-printing film 200 may be removed or stripped from the substrate 100. When the touch device is attached to other electronic elements, a surface of the substrate 100 that is opposite to the surface of the substrate 100 where the first sensing electrodes 230 and the second sensing electrodes 240 are formed thereon, is formed as a touching surface for users.

Figure 3A:
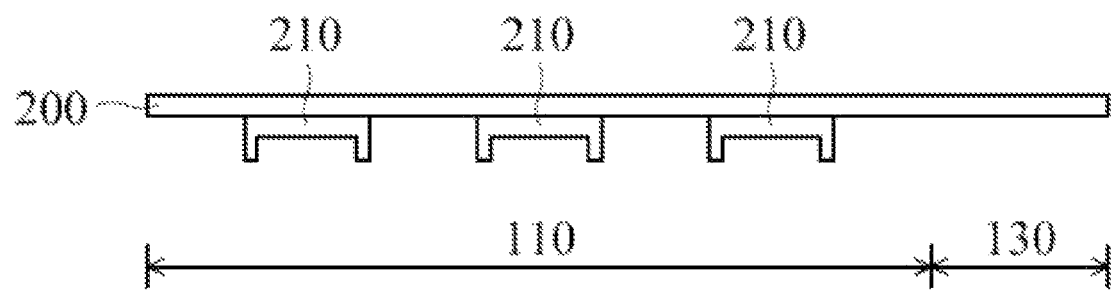
FIG. 3A to FIG. 3E are cross-sectional views of a manufacturing method of a touch device in accordance with another embodiment of the present disclosure.

FIGS. 3A to 3E are cross-sectional views of an exemplary embodiment of a manufacturing method of the touch device according to the present disclosure, wherein elements in FIGS. 3A to 3E that are the same as those in FIGS. 1A to 1E-2 are labeled with the same reference numbers as in FIGS. 1A to 1E-2 and are omitted here for brevity. Referring to FIG. 3A, a transfer-printing film 200 is provided. A plurality of jumpers 210 spaced apart from each other is formed on the transfer-printing film 200 by a first printing process.

Figure 3B:
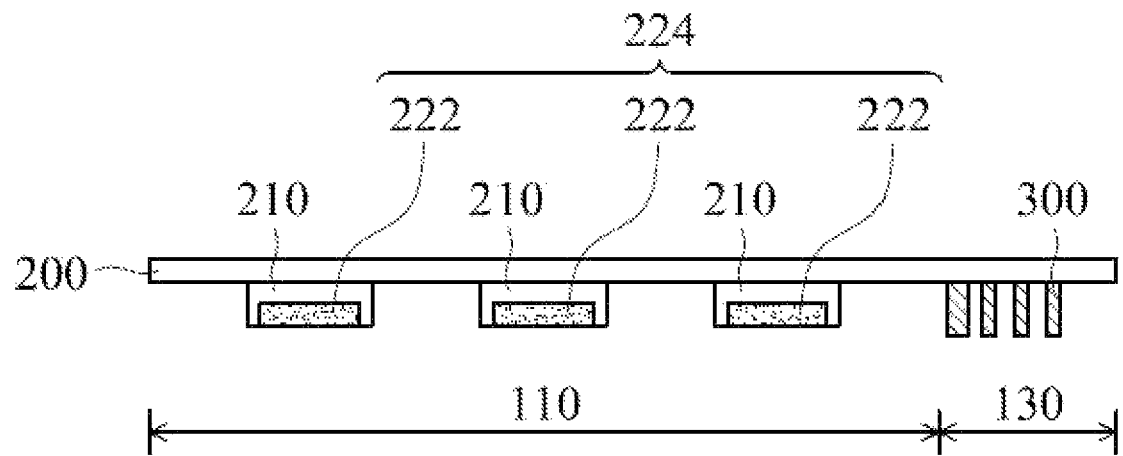

Next, referring to FIG. 3B, an insulating layer 224 is formed on the jumpers 210 by a second printing process. The insulating layer 224 comprises a plurality of insulating spacers 222 corresponding to the jumpers 210. In another embodiment, similar to the embodiment in FIG. 1D-2, the insulating layer may be a continuous layer (not shown) and comprise a plurality of pairs of holes. The insulating layer 224 is used for electrically insulating the jumpers 210 from the subsequently formed first sensing electrodes 230. A plurality of traces 300 is then formed on the transfer-printing film 200 corresponding to the border region 130. In other embodiments, the plurality of jumpers 210 and the plurality of traces 300 may be simultaneously formed by the first printing process or the plurality of traces 300 may be formed between the steps of forming the jumpers 210 and the insulating layer 224.

Figure 3C:
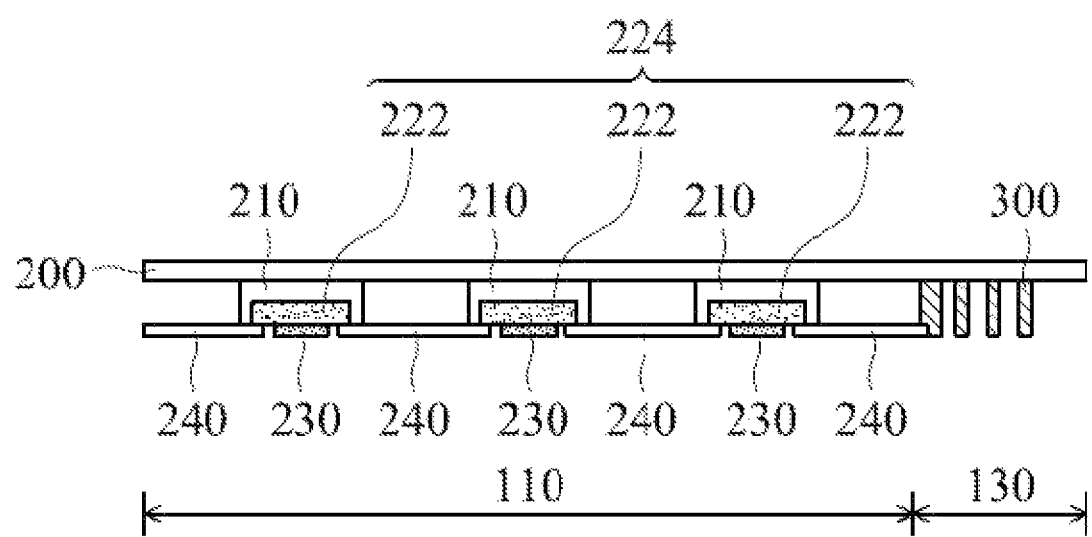

Referring to FIG. 3C, a plurality of first sensing electrodes 230 and a plurality of second sensing electrodes 240 insulated from each other and in a staggered arrangement are formed on the jumpers 210 and the insulating spacers 222 by a third printing process. A plurality of gaskets (not shown) can be disposed between the transfer-printing film 200 and the plurality of second sensing electrodes 240 to make the surface of the plurality of second sensing electrodes 240 smooth. The first sensing electrodes 230 are arranged along a first axial direction, such as the x-direction, and each of the first sensing electrodes 230 is a continuous structure. The second sensing electrodes 240 are arranged apart from each other along a second axial direction, such as the y-direction. Jumper regions 120 are defined between the adjacent second sensing electrodes 240. The jumper regions 120 and the jumpers 210 correspond to each other and the jumpers 210 are electrically connected to the adjacent second sensing electrodes 240. Moreover, the traces 300 are electrically connected to the first sensing electrodes 230 and the second sensing electrodes 240, respectively. In the embodiment, the jumpers 210, the insulating spacers 222, the first sensing electrodes 230, and the second sensing electrodes 240 are sequentially manufactured by different printing processes. Forming the sensing electrodes in the last step of the gravure printing process may prevent the sensing electrodes from being scratched or damaged.

Figure 3D:
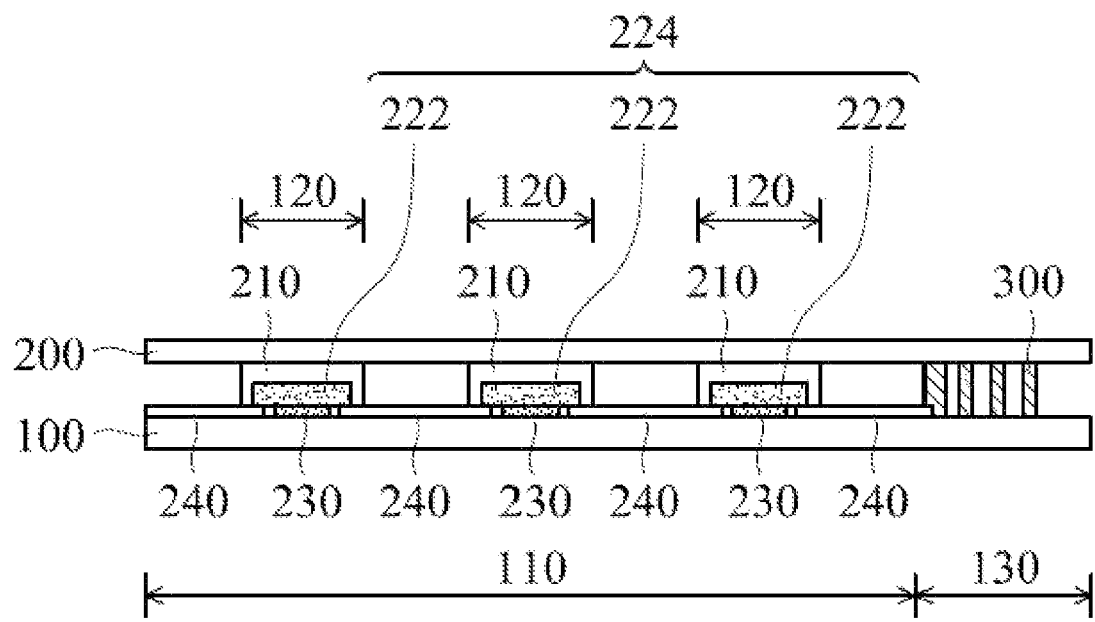

Referring to FIG. 3D, the transfer-printing film 200 having the jumpers 210, the insulating layer 224, the traces 300, the first sensing electrodes 230, and the second sensing electrodes 240 is attached to the substrate 100, such that the first sensing electrodes 230 and the second sensing electrodes 240 are on the substrate 100 corresponding to the viewing region 110 and the traces 300 are on the substrate 100 corresponding to the border region 130. Moreover, a heat or ultraviolet treatment may be performed according to the materials of the transfer-printing film 200, thereby curing the jumpers 210, the insulating layer 224, the traces 300, the first sensing electrodes 230, and the second sensing electrodes 240.

Figure 3E:
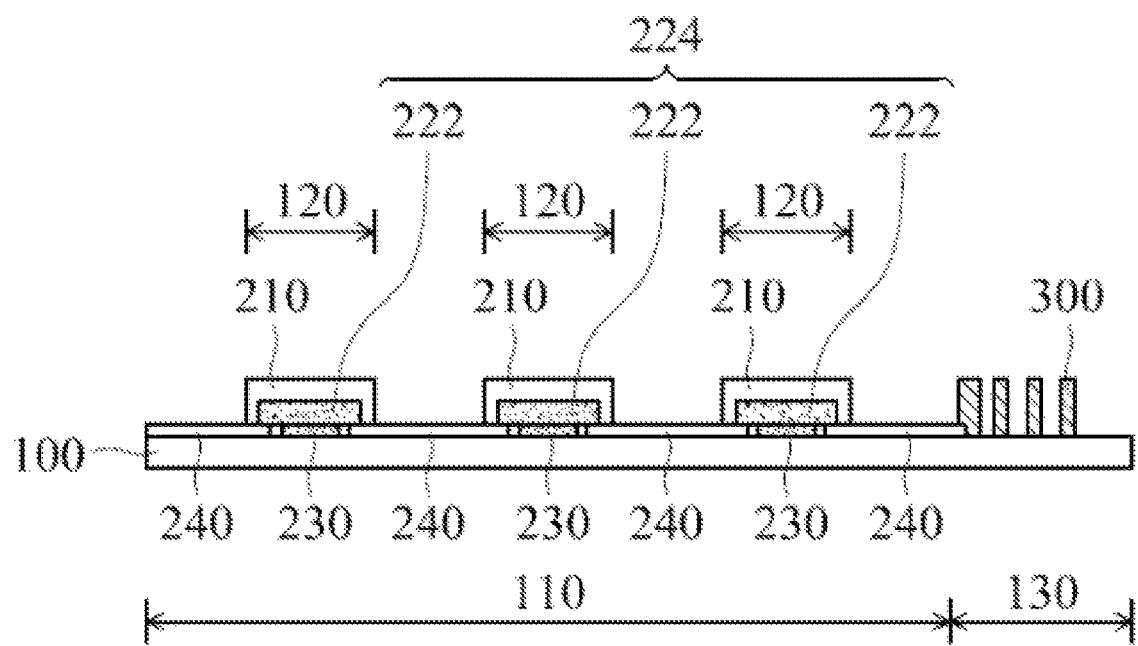

Next, referring to FIG. 3E, in order to subsequently manufacture other functional layers, such as a protective layer or an anti-refractive layer, of the touch device or help the touch device to attach to other electronic elements, such as a display module, the transfer-printing film 200 may be removed or stripped from the substrate 100. When the touch device is attached to other electronic elements, a surface of the substrate 100 that is opposite to the surface of the substrate 100 where the first sensing electrodes 230 and the second sensing electrodes 240 are formed thereon, is formed as a touching surface for users. In addition, in other embodiments, the jumpers 210, the insulating layer 224, the traces 300, the first sensing electrodes 230, and the second sensing electrodes 240 may be formed on the substrate 100 respectively, by multiple transfer-printing processes.

In the above-mentioned embodiments, the jumpers 210 may be composed of optical transparent ink materials, such as, but not limited to, colloid solution of nano silver, colloid solution of ITO, colloid solution of IZO, colloid solution of ITFO, colloid solution of AZO, colloid solution of FZO, colloid solution of nano carbon tube, or colloid solution of PEDOT, having a conductivity greater than $1/\Omega cm$. The insulating layer 224 may be composed of the insulating ink, such as, but not limited to, optical transparent ink, having conductivity less than $10^{-10}/\Omega cm$. The traces 300 may be composed of conductive ink, such as silver colloid, copper colloid or carbon colloid, having a conductivity greater than $1/\Omega cm$. The transfer-printing film 200 may be composed of flexible plastic film, such as, but not limited to, polyethylene terephthalate (PET), polyethylene, polypropylene, polyvinyl chloride, polystyrene, polyvinyl alcohol, or polyimide. Moreover, the transfer-printing film 200 may have a thickness of between 20 $\mu m$ and 200 $\mu m$. According to the materials of the transfer-printing film 200, thermal transfer-printing, cold transfer-printing, or room temperature transfer-printing may be used for the transfer-printing process. The substrate 100 may be composed of glass, plastic, or another conventional transparent material.

According to the embodiments, compared to conventional fabricating method of the photolithography process, the fabrications of at least one of the jumpers, the insulating layer and the sensing electrodes using the transfer-printing process improves material selectivity of the sensing electrodes of the touch device and the material of the sensing electrodes is not limited to high temperature resistant materials. Moreover, the jumpers, the insulating layer, and the sensing electrodes of the touch device are fabricated by performing the transfer-printing process using the transfer-printing film, such that damage to the previously formed layer structure during the formation of the next layer thereon may be reduced or eliminated and the yield improved. In addition, since the transfer-printing process is used instead of the sputtering, exposure and developing processes, the fabricating process is simplified and production efficiency is also increased. Moreover, the use of expensive equipment (such as the equipment for the sputtering, exposure and developing processes) is not required. Therefore, price competitiveness can be improved and the pollution caused by chemical solutions can be reduced.

While certain embodiments have been shown and described, various modifications and substitutions may be made thereto without departing from the spirit and scope of the disclosure. Therefore, it is to be understood that the present disclosure has been described by way of illustration and not limitations.

What is claimed is:

1. A manufacturing method of a touch device, comprising:
providing a substrate having a viewing region;
forming a plurality of first sensing electrodes and a plurality of second sensing electrodes insulated from and in a staggered arrangement with the plurality of first sensing electrodes on the substrate corresponding to the viewing region, wherein a plurality of jumper regions are defined between adjacent second sensing electrodes of the plurality of second sensing electrodes;

forming an insulating layer on the plurality of first sensing electrodes by a transfer-printing process; and transfer-printing a plurality of jumpers onto the insulating layer, wherein the plurality of jumpers is electrically connected to the adjacent second sensing electrodes and insulated from the first sensing electrodes by the insulating layer;

wherein the insulating layer and the plurality of jumpers are formed by the transfer-printing process through one transfer-printing film, and the transfer-printing process comprises:

forming the plurality of jumpers spaced apart from each other and on the transfer-printing film;

forming the insulating layer on the plurality of jumpers; and attaching the transfer-printing film having the plurality of jumpers and the plurality of jumpers to the substrate, wherein the plurality of jumpers corresponds to the jumper regions and insulated from the first sensing electrodes by the insulating layer.

2. The manufacturing method of claim 1, wherein the plurality of jumpers are formed on the transfer-printing film by a first printing process and the insulating layer is formed on the plurality of jumpers by a second printing process.

3. The manufacturing method of claim 1, wherein the plurality of first sensing electrodes, the plurality of second sensing electrodes and the insulating layer are formed by a transfer-printing process.

4. The manufacturing method of claim 1, wherein the insulating layer comprises a plurality of insulating spacers spaced apart from each other and corresponding to the jumper regions.

5. The manufacturing method of claim 1, wherein the insulating layer comprises a plurality of pairs of holes corresponding to the jumper regions and each jumper is electrically connected to the corresponding second sensing electrode through each pair of holes.

6. The manufacturing method of claim 1, wherein the plurality of jumpers has a conductivity larger than $1/\Omega cm$ and the insulating layer has a conductivity smaller than $10^{-10}/\Omega cm$.

7. The manufacturing method of claim 1, wherein the step of transfer-printing comprises:

forming the plurality of jumpers spaced apart from each other on a transfer-printing film; and attaching the transfer-printing film having the plurality of jumpers to the substrate, wherein the plurality of jumpers corresponds to the jumper regions.

8. The manufacturing method of claim 7, further comprising removing the transfer-printing film attached to the substrate.

9. The manufacturing method of claim 7, wherein the plurality of jumpers are formed on the transfer-printing film by a printing process.

10. The manufacturing method of claim 1, wherein the substrate further comprises a border region surrounding the viewing region, and the method further comprises forming a plurality of traces on the substrate corresponding to the border region to be electrically connected to the plurality of first sensing electrodes and the plurality of second sensing electrodes, respectively.

11. The manufacturing method of claim 10, wherein the plurality of traces are formed by a transfer-printing process.

12. A manufacturing method of a touch device, comprising:

providing a substrate having a viewing region;

forming a plurality of first sensing electrodes and a plurality of second sensing electrodes insulated from and in a staggered arrangement with the plurality of first sensing electrodes on the substrate corresponding to the viewing region, wherein a plurality of jumper regions are defined between adjacent second sensing electrodes of the plurality of second sensing electrodes;

forming an insulating layer on the plurality of first sensing electrodes, wherein the plurality of first sensing electrodes, the plurality of second sensing electrodes and the insulating layer are formed by a transfer-printing process; and transfer-printing a plurality of jumpers onto the insulating layer, wherein the plurality of jumpers is electrically connected to the adjacent second sensing electrodes and insulated from the first sensing electrodes by the insulating layer;

wherein the plurality of first sensing electrodes, the plurality of second sensing electrodes, the insulating layer and the plurality of jumpers are formed by the transfer-printing process through one transfer-printing film, and the transfer-printing process comprises:

forming the plurality of jumpers spaced apart from each other on the transfer-printing film; forming the insulating layer on the plurality of jumpers; forming the plurality of first sensing electrodes and the plurality of second sensing electrodes on the insulating layer; and attaching the transfer-printing film having the plurality of first sensing electrodes, the plurality of second sensing electrodes, the insulating layer, and the plurality of jumpers to the substrate, wherein the plurality of jumpers corresponds to the jumper regions and insulated from the first sensing electrodes by the insulating layer.

13. The manufacturing method of claim 12, wherein the plurality of jumpers are formed on the transfer-printing film by a first printing process, the insulating layer are formed on the plurality of jumpers by a second printing process, and the plurality of first sensing electrodes and the plurality of second sensing electrodes are formed on the insulating layer by a third printing process.

14. The manufacturing method of claim 12, wherein the insulating layer comprises a plurality of insulating spacers spaced apart from each other and corresponding to the jumper regions.

15. The manufacturing method of claim 12, wherein the insulating layer comprises a plurality of pairs of holes corresponding to the jumper regions and each jumper is electrically connected to the corresponding second sensing electrode through each pair of holes.

16. The manufacturing method of claim 12, wherein the plurality of jumpers has a conductivity larger than $1/\Omega cm$ and the insulating layer has a conductivity smaller than $10^{-10}/\Omega cm$.

17. The manufacturing method of claim 12, further comprising removing the transfer-printing film attached to the substrate.

18. The manufacturing method of claim 12, wherein the substrate further comprises a border region surrounding the viewing region, and the method further comprises forming a plurality of traces on the substrate corresponding to the border region to be electrically connected to the plurality of first sensing electrodes and the plurality of second sensing electrodes, respectively.

19. The manufacturing method of claim 18, wherein the plurality of traces are formed by a transfer-printing process.

* * * * *